United States Patent [19]
Yu

[11] Patent Number: 5,361,185
[45] Date of Patent: Nov. 1, 1994

[54] DISTRIBUTED VCC/VSS ESD CLAMP STRUCTURE

[75] Inventor: James Yu, San Jose, Calif.

[73] Assignee: Advanced Micro Devices, Inc., Sunnyvale, Calif.

[21] Appl. No.: 19,937

[22] Filed: Feb. 19, 1993

[51] Int. Cl.$^5$ .......................... H02H 3/20; H02H 9/00
[52] U.S. Cl. ....................................... 361/111; 361/91
[58] Field of Search ................ 361/56, 91, 118, 111, 361/117; 307/550; 257/355, 358

[56] References Cited

U.S. PATENT DOCUMENTS

| | | | |
|---|---|---|---|
| 4,730,129 | 3/1988 | Kunitoki et al. | 307/362 |
| 5,237,395 | 8/1993 | Lee | 257/358 |
| 5,255,146 | 10/1993 | Miller | 361/56 |

Primary Examiner—Jeffrey A. Gaffin
Assistant Examiner—Ronald W. Leja
Attorney, Agent, or Firm—Davis Chin

[57] ABSTRACT

A distributed VCC/VSS clamp structure (10) for preventing inadvertent damage to semiconductor integrated circuits caused by an electrostatic discharging event occurring between any two external pins thereof includes a clamp transistor (Q4) which is disposed locally to every ESD protection circuitry associated with each input and output pin of a semiconductor integrated circuit. The clamp transistor is activated so as to provide a secondary discharging path when the direct clamp discharging paths of the ESD protection circuitry are not forming a complete path.

3 Claims, 2 Drawing Sheets

DISTRIBUTED VCC/VSS ESD CLAMP STRUCTURE

BACKGROUND OF THE INVENTION

This invention relates generally to semiconductor protection circuitry and more particularly, it relates to a distributed VCC/VSS ESD clamp structure for producing a local and immediate, indirect discharging path so as to prevent inadvertent damage caused by an electrostatic discharge (ESD) or electrical overstress (EOS) event occurring between any two of the external pins of an integrated circuit package when the direct clamp discharging paths are not forming a complete path.

It is generally well-known in the prior art that the magnitude of an electric voltage allowed to be applied to an integrated circuit package is rather limited since the physical size of the integrated circuit package is fairly small and the internal circuitry thereof are tightly packed together with minimum geometries for the merit of performance and integration. When the integrated circuit package is not being used, for example, in storage or handling, the external leads or pins thereof are susceptible to being exposed to a static charge thereon. Such static discharges can be of a catastrophic nature with sufficient energy to cause melting, short circuiting, physical damage, or even destruction of the semiconductor element or chip mounted within the integrated circuit package.

In order to protect the semiconductor chip in the integrated circuit package from being destroyed when such static discharges occur, there has been provided in the prior art ESD protection circuitry which have taken the form of a small diode, a Zener diode, or a transistor connected between either an input pin or an output pin and VCC and VSS power supply pins. These protection circuits break down when the semiconductor chip encounters an unexpectedly high voltage so as to protect the semiconductor chip and to thereby prevent its destruction. However, these prior art protection devices suffer from the drawback that they only offer protection either between the input or output pin and a power supply pin. Thus, in such protection devices, the charges accumulated on either the input pins or the output pins were discharged only when the power supply pin was made to come in contact with the ground potential. Accordingly, the prior art protection devices offer no protection when another input pin or output pin was the one being referenced to ground. Also, no immediate discharge path was provided when the charges were accumulated on a floating power supply pin through an input or output pin.

There has also been provided heretofore power supply clamps, such as VCC/VSS clamp structures, in an attempt to overcome problems associated with the prior art ESD protection circuitry. However, these prior art power supply clamps, either single or multiple, were usually a separate structure that were located at a different part of the semiconductor chip or die, i.e., top, bottom or side peripheral portions thereof. Accordingly, upon the occurrence of an ESD or EOS event, the time constant between the pin on which electrostatic charges are applied (zapped pin) and the power supply clamp may prevent the desired early or timingly discharging through the remote VCC/VSS clamp structure, thereby resulting in an ESD failure.

It would therefore be desirable to provide a VCC/VSS clamp structure which is local to every ESD protection circuitry associated with each of the input and output pins of the integrated circuit package and which is distributed with respect to the bonding pads thereof. This is achieved in the present invention by the provision of local, distributed VCC/VSS clamp structures connected to each ESD structure associated with the input and output pins so as to produce a secondary discharging path in the event that the primary discharging path (through the ESD structure) is incomplete.

SUMMARY OF THE INVENTION

Accordingly, it is a general object of the present invention to provide a distributed VCC/VSS clamp structure for producing a local and immediate, indirect discharging path so as to prevent inadvertent damage caused by an ESD or EOS event which is relatively simple and economical to manufacture and assembly, but yet overcomes the disadvantages of the prior art ESD protection circuitry.

It is an object of the present invention to provide a distributed VCC/VSS clamp structure for producing a local and immediate, indirect discharging path so as to prevent inadvertent damage caused by an electrostatic discharge or electrical overstress event occurring between any two of the external pins of an integrated circuit package when the direct clamp discharging paths are not forming a complete path.

It is another object of the present invention to provide a distributed VCC/VSS clamp structure which includes a clamp transistor being disposed locally to every ESD protection circuitry associated with each input and output pin of the semiconductor integrated circuit.

In accordance with these aims and objectives, the present invention is concerned with the provision of a distributed VCC/VSS clamp structure for preventing inadvertent damage to semiconductor integrated circuits caused by an electrostatic discharge event occurring between any two external pins thereof which includes a VCC power supply bus, a VSS power supply bus, and a clamp transistor. The clamp transistor is disposed locally to every ESD protection circuitry associated with each input and output pin of the semiconductor integrated circuit.

The clamp transistor is formed of an N-channel MOS transistor having its drain connected to the VCC power supply bus, its source connected to the VSS power supply bus, and its gate connected to a first internal node coupled to the ESD protection circuitry. The clamp transistor is activated only when the ESD protection circuitry is unable to supply a primary discharging path in order to produce a secondary discharging path from a zapped pin through its source-drain conduction path to a grounded pin, thereby protecting the internal circuits of the semiconductor integrated circuit.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
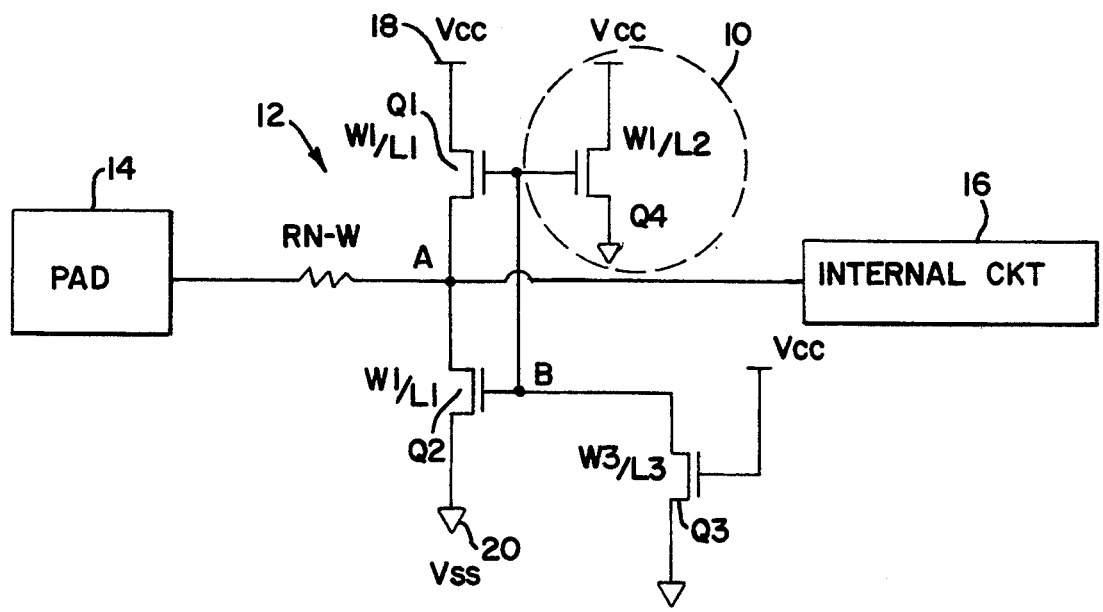
FIG. 1 is an equivalent circuit diagram of a local, distributed VCC/VSS clamp structure, constructed in accordance with the principles of the present invention.
Figure 2:
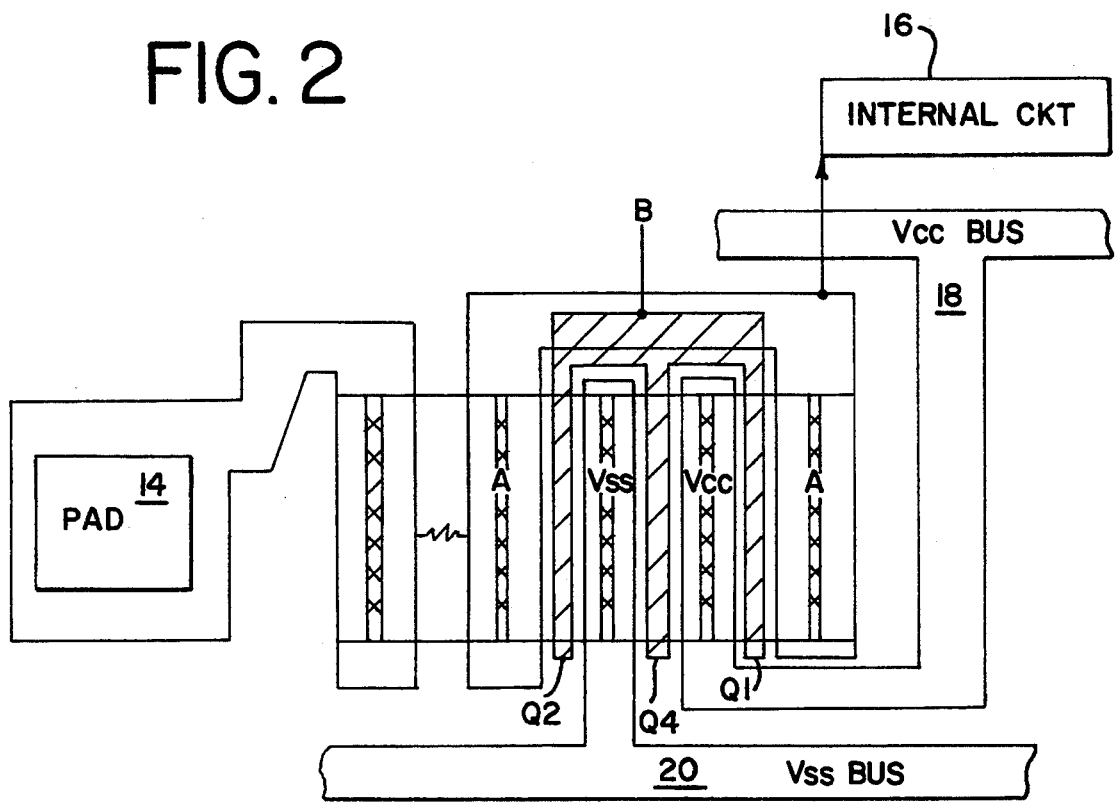
FIG. 2 is a top plan layout representation of the clamp structure of FIG. 1.

Referring now in detail to the drawings, there is shown in FIG. 1 an equivalent schematic circuit diagram of a local, distributed VCC/VSS clamp structure 10, constructed in accordance with the principles of the present invention. The clamp structure 10 provides a local and immediate, indirect discharging path so as to prevent inadvertent damage caused by an electrostatic discharge (ESD) or electrical overstress (EOS) event occurring between any two of the external pins of an semiconductor integrated circuit package (not shown), when the direct clamp discharging paths are not forming a complete path. In order to prevent the semiconductor integrated circuit package from being damaged or destroyed, the clamp structure 10 is connected in parallel to every ESD structure 12 associated with the input and/or output pad 14. It should be understood that the pad 14 is connected to the external pins of the integrated circuit by a bonding wire (also not shown). A top plan layout representation of the clamp structure of FIG. 1 is illustrated in FIG. 2.

The input or output pad 14 is coupled to an internal circuit 16 to be protected via an internal node A. The ESD structure 12, for example, includes a first N-channel MOS transistor Q1 and a second N-channel MOS transistor Q2. The transistor Q1 has its drain connected to a VCC power supply bus 18 and its source connected to the internal node A. The transistor Q2 has its drain also connected to the internal node A and its source connected to a VSS power supply bus 20. The gates of the transistors Q1 and Q2 are connected together and to another internal node B. The sizes of the transistors Q1 and Q2 is given by the relationship between the channel width W1 and the channel length L1, where W1 has a dimension between 170-340 microns and L1 has a dimension of approximately 1.6 microns.

The ESD structure 12 further includes a third N-channel MOS transistor Q3 having its drain connected to the internal node B and to the gates of the first and second MOS transistors Q1 and Q2. The third transistor Q3 has its source connected to the VSS power supply bus 20 and its gate connected to the VCC power supply bus 18. The channel width W3 of the transistor Q3 has a dimension of 20 microns, and the channel length L3 thereof has a dimension of approximately 2.0 microns. A diffusion-type resistor $R_{N-W}$ is connected in series between the input/output pad 14 and the internal node A, which is connected to the internal circuit of the integrated circuit for limiting and absorbing the peak discharging current (energy). The ESD structure described thus far is quite conventional and does not form a part of the present invention.

The local, distributed VCC/VSS clamp structure 10 of the present invention is comprised of a fourth N-channel MOS transistor Q4. The transistor Q4 has its drain connected to the VCC power supply bus 18 and its source connected to the VSS power supply bus 20. The gate of the transistor Q4 is connected to the gates of the transistors Q1 and Q2 at the internal node B. The channel width W1 of the transistor Q4 is the same range as the transistors Q1 and Q2, but the channel length L2 has a dimension of approximately 1.0 microns. This channel length L2 is maintained to be at the minimal value of technology so as to provide an earlier response time due to a lower breakdown voltage.

In order to explain the operation of the local, distributed clamp structure 10, it is needed to illustrate initially how the overstress is created between the VCC power supply bus 18 and the VSS power supply bus 20. In a first case, it will be assumed that the pin zapped is connected to the pad 14 functioning as the output pin and the pin grounded is either the VSS power supply pin or all of the input and output pins tied together.

Figure 3:
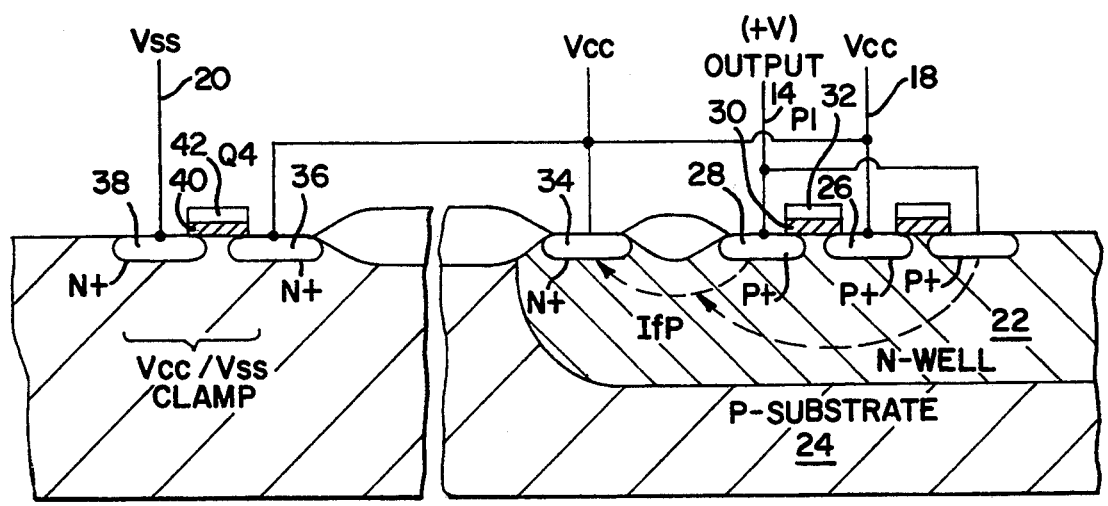
FIG. 3 is a cross-sectional view of the VCC/VSS clamp structure which implements the circuit of FIG. 1 when the pad 14 is functioning as an output pad and an excessive positive voltage is applied thereto.

In FIG. 3, there is shown a cross-sectional view of the VCC/VSS clamp structure which implements the circuit of FIG. 1 when the pad is functioning as an output pad and an excessive positive voltage is applied thereto. When the pad 14 is used as the output pad, there is typically a P-channel pull-up output transistor P1 associated with it. The transistor P1 is formed by an N-well region 22 diffused in a p- substrate 24. A first p+ contact diffusion 26 is formed in the N-well region 22 and defines the source of the transistor P1. A second p+ contact diffusion 28 is also formed in the N-well region 22 and defines the drain of the transistor P1. A thin oxide 30 is used for the gate insulation and is disposed over the N-well region 22 between the p+ diffusions 26 and 28. A polysilicon layer 32 is disposed on top of the thin oxide 30 to form the gate of the transistor P1 which is connected to the internal circuit. The source region 26 is coupled to the VCC power supply bus 18, and the drain region 28 is coupled to the output pad 14. It will be noted that a N+ contact diffusion 34 is also formed in the N-well region 22, which is coupled to the VCC power supply bus 18.

The VCC/VSS clamp transistor Q4 is formed in the p-substrate 24. A first N+ contact diffusion 36 is formed in the substrate 24 and defines the drain of the transistor Q4. A second N+ contact diffusion 38 is formed in the substrate 24 and defines the source of the transistor Q4. A thin oxide 40 is used for the gate insulation and is disposed over the substrate 24 between the N+ contact diffusions 36 and 38. A polysilicon layer 42 is disposed on top of the thin oxide 40 to form the gate of the clamp transistor Q4 which is connected to the internal node B. The drain region 36 is coupled to the VCC power supply bus 18, and the source region 38 is coupled to the VSS power supply bus 20.

When an excessive positive voltage appears at the output pad 14, the diode formed by the p+ diffusion 28 and the N+ diffusion 34 will become forward biased so as to raise the VCC power supply bus 18 to a more positive potential. The VCC power supply bus potential will follow the rise on the output node 14 by one diode drop (i.e., 0.6 volts). Thus, if the output node 14 rises to +15 volts, the VCC power supply bus potential will be at +14.4 volts. This causes an overstress condition to exist between the VCC power supply bus 18 and the VSS power supply bus 20. If the transistor Q2 in the ESD structure does not react quickly enough due to a longer channel length to provide a discharging path, the internal circuit 16 may be damaged or destroyed but for the clamping transistor Q4. With the provision of the transistor Q4 of the present invention, it can be seen that it will be turned on quickly so as to create a secondary discharging path from the N+ diffusion 36, through the p- substrate 24, N+ diffusion 38, and the VSS power supply bus 20.

Figure 4:
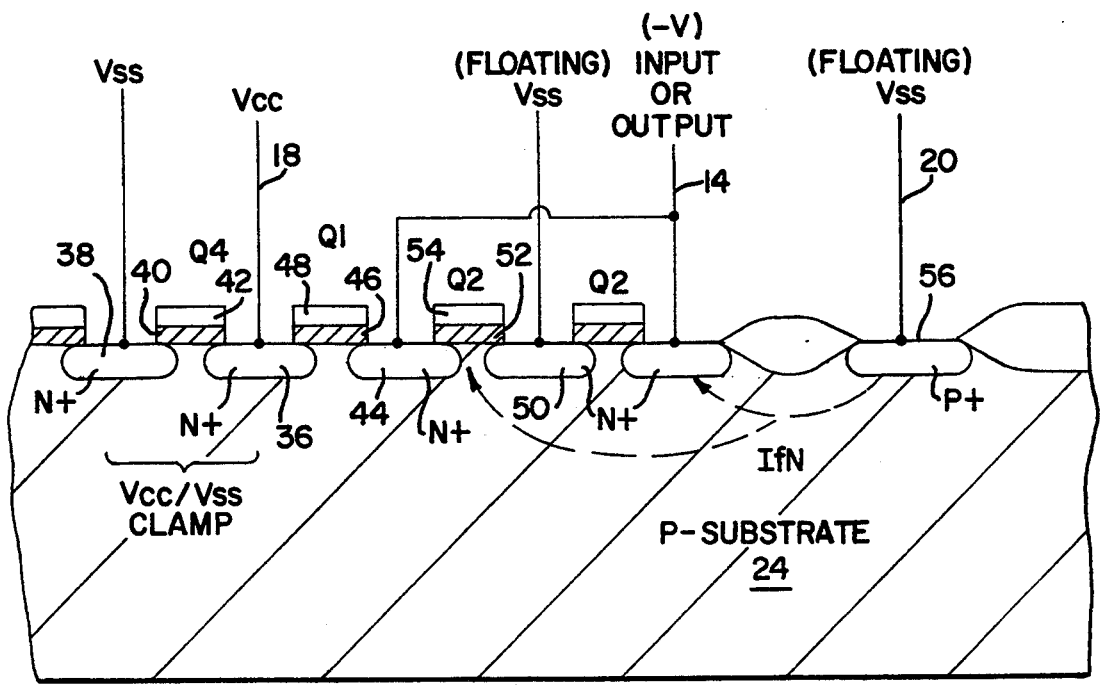
FIG. 4 is a cross-sectional view of the VCC/VSS clamp structure which implements the circuit of FIG. 1 when the pad 14 is functioning as an input or output pad and an excessive negative voltage is applied thereto.

In a second case, it will be assumed that the pin zapped is connected to the pad 14 functioning either as an output or input pad and the pin grounded is either the VCC power supply pin or all of the input and output pins tied together. In FIG. 4, there is shown a cross-sectional view of the VCC/VSS clamp structure which implements the circuit of FIG. 1 when the pad 14 is functioning either as an input or output pad and an excessive negative voltage is applied thereto.

The transistors Q1 and Q2 are formed in the p-substrate 24. The VCC/VSS clamp transistor Q4 is formed in the p- substrate 24 as previously discussed in FIG. 3. The N+ diffusion 36 forming the drain of the transistor Q4 is a shared region and also forms the drain of the transistor Q1. A N+ diffusion 44 is formed in the p-substrate 24 and defines the source of the transistor Q1. A thin oxide 46 is used for the gate insulation and is disposed over the p- substrate 24 between the N+ diffusions 36 and 44. A polysilicon layer 48 is disposed on top of the thin oxide 46 to form the gate of the transistor Q1, which is connected to the internal node B. The N+ diffusion 44 is also a shared region and thus forms the drain of the transistor Q2. A N+ diffusion 50 is formed in the p- substrate 24 and forms the source of the transistor Q2. A thin oxide 52 is used for the gate insulation and is disposed over the p- substrate 24 between the N+ diffusions 44 and 50. It will be noted that a p+ diffusion 56 is also formed in the p- substrate 24, which is coupled to the VSS power supply bus 20.

When an excessive negative voltage appears at the input/output pad 14, the diode formed by the p+ diffusion 56 and the N+ diffusion 50 will become forward biased so as to lower the VSS power supply bus 20 to a more negative potential. The VSS power supply bus potential will follow the drop on the output node 14 by one diode drop, (i.e., 0.6 volts). Thus, if the output node drops to −15 volts, the VSS power supply bus potential will be at −14.4 volts. This causes an overstress condition to exist between the VCC power supply bus 18 and the VSS power supply bus 20. If the transistor Q1 in the ESD structure does not react quick enough due to a longer channel length to provide a discharging path, the internal circuit 16 may be damaged or destroyed but for the clamp transistor Q4. With the provision of the transistor Q4, it will be noted again that it turns on quickly so as to create a secondary discharging path from the VSS power supply bus, N+ diffusion 38, through the p-substrate 24, N+ diffusion 36, and the VCC power supply bus.

As can be seen from the operation thus described, the primary discharging path is provided by direct clamps in the ESD structure 12. The localized VCC/VSS clamps are used to provide a secondary discharging path in the event that the direct clamps do not function properly to form a complete path. As a result, it will be understood that the localized VCC/VSS clamp structures are designed to provide a back-up protection since they are placed close to the ESD event and thus will respond faster than the remote prior art power supply clamps. Further, the localized VCC/VSS clamps are formed of minimum geometry rather than the robust layout (not minimal dimensions) of the ESD structures.

From the foregoing detailed description, it can thus be seen that the present invention provides a distributed VCC/VSS clamp structure for producing a local and immediate, indirect discharging path so as to prevent inadvertent damage caused by electrostatic discharge which includes a clamp transistor. The clamp transistor is disposed locally to every ESD protection circuitry associated with each input and output pin of the semiconductor integrated circuit.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A distributed VCC/VSS clamp structure for preventing inadvertent damage to internal circuits of semiconductor integrated circuit packages caused by an electrostatic discharge event occurring between any two external pins thereof, said external pins being formed of either an input pin, an output pin, a VCC power supply pin, or a VSS power supply pin, comprising:

a VCC power supply bus (18);
a VSS power supply bus (20);
a plurality of ESD protection circuitry interconnected between said VCC power supply bus and said VSS power supply bus, each one of said plurality of ESD protection circuitry being operatively connected to a corresponding one of external pins of the semiconductor integrated circuit so as to provide primary discharging paths when an electrostatic discharge is applied to one of the external pins defining a zapped pin and another remaining one of the external pins is referenced to ground;
a plurality of clamp transistors (Q4) each being connected in parallel to and disposed in close proximity to a corresponding one of said plurality of ESD protection circuitry associated with each input and output pin of the semiconductor integrated circuit;
each of said plurality of clamp transistors being formed of an N-channel MOS transistor, said N-channel MOS transistor having its drain connected to the VCC power supply bus, its source connected to the VSS power supply bus, and its gate connected to a first internal node coupled to the corresponding one of said plurality of ESD protection circuitry;
each of said plurality of ESD protection circuitry including a first N-channel MOS transistor (Q1) having its drain connected to the VCC power supply bus, its source connected to a second internal node to which the internal circuit to be protected is connected, and its gate connected to the first internal node;
each of said plurality of ESD protection circuitry further including a second N-channel MOS transistor (Q2) having its drain connected to the second internal node, its source connected to the VSS power supply bus, and its gate connected to the first internal node; and each of said plurality of clamp transistors being activated only when the corresponding one of said plurality of ESD protection circuitry is unable to supply the primary discharging path in order to produce a secondary discharging path from the zapped pin through its source/drain conduction path to the external pin referenced to ground, thereby protecting the internal circuits of the semiconductor integrated circuit.

2. A clamp structure as claimed in claim 1, wherein each of said plurality of clamp transistors is formed of a minimum channel length so as to insure a relatively short response time due to a lower breakdown voltage.

3. A clamp structure as claimed in claim 1, wherein each of said plurality of clamp transistors is formed of dimensions relatively smaller than that of the ESD protection circuitry to facilitate its operation.

* * * * *